(12) United States Patent
Thoday et al.

(10) Patent No.: US 10,323,817 B2
(45) Date of Patent: Jun. 18, 2019

(54) LIGHT ASSEMBLY AND VEHICLE DESIGN ELEMENT INCLUDING SUCH LIGHT ASSEMBLY

(71) Applicant: SMR Patents S.à.r.l., Luxembourg (LU)

(72) Inventors: Sam Thoday, Sheidow Park (AU); Brad Gibson, Calista (AU); Daniel Flynn, Morphett Vale (AU); Simon Belcher, South Plympton (AU)

(73) Assignee: SMR Patents S.à.r.l., Luxembourg (LU)

( * ) Notice: Subject to any disclaimer, the term of this patent is extended or adjusted under 35 U.S.C. 154(b) by 0 days.

(21) Appl. No.: 15/743,556

(22) PCT Filed: Jul. 8, 2016

(86) PCT No.: PCT/EP2016/066355

§ 371 (c)(1),
(2) Date: Jan. 10, 2018

(87) PCT Pub. No.: WO2017/009260

PCT Pub. Date: Jan. 19, 2017

(65) Prior Publication Data

US 2018/0202626 A1 Jul. 19, 2018

(30) Foreign Application Priority Data

Jul. 10, 2015 (AU) .............................. 2015902723

(51) Int. Cl.
*F21S 43/241* (2018.01)
*F21S 43/14* (2018.01)
*F21S 43/30* (2018.01)

(Continued)

(52) U.S. Cl.
CPC .......... *F21S 43/241* (2018.01); *B60R 13/005* (2013.01); *F21S 43/14* (2018.01); *F21S 43/243* (2018.01);

(Continued)

(58) Field of Classification Search
CPC .......... F21S 43/241; F21S 43/14; F21S 43/30; F21S 43/26
See application file for complete search history.

(56) References Cited

U.S. PATENT DOCUMENTS

2006/0023468 A1 2/2006 Takahashi et al.
2014/0160778 A1 6/2014 Nakada

FOREIGN PATENT DOCUMENTS

CN 201484317 U 5/2010
CN 201599656 U 10/2010
(Continued)

OTHER PUBLICATIONS

International Search Report dated Oct. 5, 2016 of International application No. PCT/EP2016/066355.

*Primary Examiner* — Joseph L Williams
(74) *Attorney, Agent, or Firm* — Jones Day

(57) ABSTRACT

A light assembly for a vehicle design element includes a light guide, the light guide including a plurality of light receiving surfaces; and a plurality of light sources, the light sources being arranged adjacent to and directed towards respective light receiving surfaces, where the light guide is shaped to define an annular base lying in a first plane and at least one circumferential flange or cylinder disposed generally orthogonal, or inwardly or outwardly splayed to the first plane, the flange or cylinder extending away from the annular base towards a viewable annular light exit, the base including a plurality of shaped elements extending away from the first plane, each shaped element defining one of the light receiving surfaces for receiving incident light from a respective adjacent light source, where a plurality of the light receiving surfaces are orientated substantially transverse to the base.

17 Claims, 11 Drawing Sheets

(51) Int. Cl.
  *F21S 43/20*   (2018.01)
  *B60R 13/00*   (2006.01)
  *F21V 8/00*    (2006.01)
  *G09F 13/04*   (2006.01)
  *G09F 13/06*   (2006.01)
  *G09F 21/04*   (2006.01)
  *G09F 13/18*   (2006.01)
  *F21S 43/243*  (2018.01)
  *F21S 43/249*  (2018.01)
  *G09F 13/22*   (2006.01)
  *G09F 7/18*    (2006.01)
  *F21Y 115/10*  (2016.01)
  *F21W 104/00*  (2018.01)
  *H05K 1/18*    (2006.01)

(52) U.S. Cl.
  CPC ............ F21S 43/249 (2018.01); F21S 43/26 (2018.01); F21S 43/30 (2018.01); G02B 6/0011 (2013.01); G09F 13/04 (2013.01); G09F 13/06 (2013.01); G09F 13/18 (2013.01); G09F 21/04 (2013.01); *F21W 2104/00* (2018.01); *F21Y 2115/10* (2016.08); *G09F 2007/1882* (2013.01); *G09F 2013/044* (2013.01); *G09F 2013/0427* (2013.01); *G09F 2013/222* (2013.01); *H05K 1/181* (2013.01); *H05K 2201/09027* (2013.01); *H05K 2201/10106* (2013.01)

(56) References Cited

FOREIGN PATENT DOCUMENTS

| | | |
|---|---|---|
| DE | 102012018782 A1 | 3/2013 |
| EP | 1911630 A1 | 4/2008 |
| JP | 2009-12558 A | 1/2009 |
| JP | 2011-63169 A | 3/2011 |
| WO | WO 2014/123939 A1 | 8/2014 |

LIGHT ASSEMBLY AND VEHICLE DESIGN ELEMENT INCLUDING SUCH LIGHT ASSEMBLY

CROSS-REFERENCE TO RELATED APPLICATIONS

This application is a national stage entry of International Patent Application No. PCT/EP2016/066355, filed Jul. 8, 2016, which claims the benefit of foreign priority to Australian Patent Application No. AU 2015902723, filed Jul. 10, 2015, each of which is incorporated by reference herein in its entirety for all purposes.

BACKGROUND

1. Field of the Invention

The following description relates to a light assembly for a vehicle design element, selected from vehicle emblems, badges, logos and the like, which can provide a uniform light output without the use of light guide optic diffusing features and without the light source being viewable. In particular the present invention refers to a light assembly for a vehicle design element, the assembly including a light guide, the light guide including a plurality of light receiving surfaces, and suited to be combined with a plurality of light sources, preferably in form of light emitting diodes (LEDs) on a circuit board, the light sources being arranged adjacent to and directed towards respective light receiving surfaces.

2. Related Art

An aesthetic feature which has become desirable in automotive applications is to provide exterior badges and emblems on vehicles which feature backlighting of key features of the particular badge or emblem. Many automotive badges have an overall circular profile or feature large annular elements, and it is desirable that this annularity is able to be backlit with an even (uniform or homogenous) luminance using light emitting diodes (LEDs) input. An LED is a directional light source having a relative luminous intensity that decreases as the viewing angle is increased. This may result in the appearance of bright or hot spots to an external viewer of the badge.

Lighting systems that provide a uniform luminous intensity are known, for example systems using expensive organic light emitting diode (OLED) technology or complex lens and reflector arrangements. Highly diffusing materials are also used but these have the drawback of giving a milky or hazy appearance and have poor optical efficiency. Optic features may also be used on clear materials to diffuse light, but these have the drawback that the optic features are visible in the unlit state which is undesirable. A further desirable feature is that the LED input is not directly visible to the external viewer of the badge.

CN 201 484 317 U discloses a luminous automobile mark and a luminous subassembly thereof, wherein a logo is formed by a non-planar light guide base having an elliptical outer frame. The light guide base is provided with holes for housing light emitting diodes in such a manner that light can exit from plural portions of the elliptical outer frame as well as from portions in bridging elements in the interior of the elliptical frame.

CN 201 599 656 U relates to a marker lamp that comprises a base, a surface of the base having a light guide structure, a circuit board disposed on one side of the base, a plurality of light emitting diodes disposed on the surface of the base cover provided on one side of the circuit board and having a light reflecting structure on a side facing the light emitting diode of the cover, and an ornamental body disposed on a side of the circuit board. The cover body, the circuit board and the decoration body have a first pattern layer protruding from the top of the decoration body and a zigzag structure provided on the bottom of the decoration body.

DE 10 2012 018 782 A1 relates to a device for indicating a logo on a vehicle, wherein a transparent body is shaped so as to include recesses for housing light emitting diodes in such a manner that the light emitted by at least some of the light emitting diodes exits the transparent body via an outer protrusion of the transparent body to the side opposite to the recesses. There are further protrusions in the center of the transparent body.

JP 2011 063 169 A describes a luminescent display device that includes a first device layer, a second reflective layer provided on the front side relative to the first reflective layer, a light guide body provided between the first reflective layer and the second reflective layer, and an emblem provided on the front side from the light guide body. The light guide body is exposed along the edge parts of the emblem, and has projection parts projected to the front side. The groove parts are formed on the back side of the light guide body at the position along the edge parts of the emblem when seen from the thickness direction of the light guide body. An uneven strip is formed at the most top part of the projection parts, and an uneven strip is formed on the deepest part of the groove part.

From EP 1 911 630 A1, an assembly for providing a lighted logo is known, in which a support element supports an emblem on its upper side, and wherein a circular light guide body is attached to the back side of the support. The circular light guide body includes an annular rim that corresponds to a contour of the emblem.

US 2006/023468 A1 is concerned with a light emitting device comprising a mark body, a substrate arranged in back of the mark body, an LED mounted on an opposite surface of the substrate to the mark body, and a light guide arranged on a closer side of the substrate to the LED and having an upper surface serving as a light introducing surface for introducing LED-based light, a side surface serving as a light emitting surface and a backside subjected to a light diffuse reflection process to cause diffuse reflection on the backside.

JP 2009 012 558 A describes a decorative structure including a symbol member having a symbol mark formed by an opaque plate and which is attached to the member to be mounted. A base member formed in a plate shape matching the symbol member is interposed between the member to be mounted and the symbol member. A main LED lamp emits light reaching the peripheral edge part of the base member through the inside of the base member. A main storage part for storing the LED lamp is formed in the base member. A main irregular reflecting surface for irregularly reflecting light is formed at a peripheral edge part.

WO 2014/123939 A1 discloses a vehicle visor including a vanity light assembly and an actuator assembly. The visor vanity additionally includes a mirror and a movable mirror cover. The light assembly includes a light source and a light pipe for conveying light from the light source to two or more diffusers, for example, on opposite ends of the mirror. The actuator assembly includes a switching arrangement for switching the light source on and off without flicker or noise in response to the opening and closing of the mirror cover.

From US 2014/160778 A1, a vehicular lamp is known that has a light source and a light guide body. The light guide body is configured by a first and a second rod shaped light guiding portions disposed at positions spaced apart from each other, and a planar light guiding portion disposed to connect the circumferential surface portion of the first and second rod shaped light guide portions with each other. Further, the light source is configured to include a first light source and a second light source disposed to cause light to be incident from an end portion surfaces of the first and the second rod shaped light guiding portions, respectively, and then configured to make each of the first light source and the second light source to emit a different color light with each other.

SUMMARY

In an aspect, it is an object of the following description to further develop known light guides.

This object is solved in at least that the light guide is shaped to define an annular base lying in a first plane and to further define at least one circumferential flange or cylinder disposed generally orthogonal, or inwardly or outwardly splayed to the first plane, the circumferential flange or cylinder including a viewable annular light exit and extending away from the annular base of the light guide towards the viewable annular light exit, and the annular base including a plurality of shaped dements, in particular in form of disconnections, recesses, holes or wedge-shaped protrusions, extending away from the first plane, each shaped element of the light guide defining one of the light receiving surfaces for receiving incident light from a respective adjacent light source, wherein a plurality of the light receiving surfaces are orientated substantially transverse to the annular base.

It is proposed that the light guide transitions from the annular base to the flange or cylinder, sharply with a radius of less than 10% of a height of the flange or cylinder, the sharp transition facilitating internal reflection of light emitted from the light sources.

In an aspect, the light guide is shaped to include two spaced-apart circumferential flanges, each flange extending away from the annular base towards a respective viewable annular light exit, the two viewable annular light exits radially spaced apart from each other.

The light guide of other embodiments can be shaped to include two spaced apart circumferential cylinders, each cylinder extending away from the annular base towards a respective viewable annular light exit, the two viewable light exits radially spaced apart from each other.

The circumferential flanges or cylinders can be non-continuous to provide disconnections such that circumferential light entry points at disconnected surfaces on the circumference of the flanges or cylinders are provided.

It is preferred that the annular light exit includes a plurality of steps, the steps promoting internal reflection.

The light guide may be substantially transparent and without any visible discrete optic features in an un-lit state, while being diffusive in a lit state. But the light guide annulus can also be substantially transparent and non-diffusive in both a lit and un-lit state, while the circumferential flanges or cylinders are substantially transparent in an un-lit state, while being diffusive in a lit state.

A housing may be provided behind the light guide, which preferably incorporates transitional reflective optics that vary the amount of light reflected back into the circumferential flanges or cylinders and/or comprises a black material.

The light guide can also features a bridging member, manufactured from the same material as the light guide, which is located inside and bisects the substantially annular shape of the light guide, and the bridging member has first and second ends which are disposed as light receiving surfaces and a light emitting surface along its major surface.

The bridging member can have a substantially trapezoidal cross-section.

It is preferred that the printed circuit board has an annular shape and/or is coated white around the plurality of LEDs.

The printed circuit board can include additional light sources positioned adjacent to the light receiving surfaces to direct light into the bridging member.

It is proposed that the bridging member is used in conjunction with a garnish, the garnish preferably comprising cut-outs in the form of lettering or a logo.

The lens may have an outer component, preferably made from a clear material, and an inner component, preferably over moulded on the inner surface of the outer component and/or made from opaque material.

It is further proposed that the inner or outer component joins to the housing and/or the inner component sits on top of the printed circuit board and the shaped elements.

In another aspect, a vehicle design element includes a light assembly of the invention.

According to a first aspect of the present invention, there is provided a vehicle design element including a light assembly, the assembly including a light guide, the light guide including a plurality of light receiving surfaces, a plurality of light emitting diodes (LEDs), the LEDs adjacent to and directed towards respective light receiving surfaces, characterized in that the light guide is shaped to define an annular base lying in a first plane and at least one circumferential flange disposed generally orthogonal to the first plane, the circumferential flange including a viewable annular light exit and extending away from the annular base towards the viewable annular light exit, the annular base including a plurality of wedge-shaped protrusions extending away from the first plane, each protrusion defining one of the light receiving surfaces for receiving incident light from a respective adjacent LED, wherein a plurality of the light receiving surfaces are orientated substantially transverse to the annular base.

In one form, the wedge shaped protrusions are replaced by recesses or holes in the annular base.

In one form, the light guide transitions from the base to the flange sharply with a radius of less than 10% of the height of the flange, the sharp transition facilitating internal reflection of light emitted from the LEDs.

In one form, the light guide is shaped to include two spaced-apart circumferential flanges, each flange extending away from the annular base towards a respective viewable annular light exit, the two viewable annular light exits radially spaced apart from each other.

In one form, the annular light exits include a plurality of steps, the steps promoting internal reflection.

In one form, the light guide is substantially transparent and without any visible discrete optic features in an un-lit state, while being diffusive in a lit state.

In one form, the housing behind the light guide is shaped to promote reflection of light back into the circumferential flange or cylinder In one form, the light guide flange is substantially transparent and non-diffusive in a lit and unlit state and the circumferential flange or cylinder is substantially transparent in an unlit state, whilst being diffusive in a lit state.

In one form, the circumferential flange is replaced by at least one circumferential cylinder, the transition between the annular base and the circumferential cylinder, facilitating internal reflection of light emitted from the LED's efficiently into the cylinder.

BRIEF DESCRIPTION OF DRAWINGS

Embodiments of the present invention will be discussed with reference to the accompanying drawings wherein.

In the following description, like reference characters designate like or corresponding parts throughout the figures.

DESCRIPTION OF EMBODIMENTS

Figure 1:
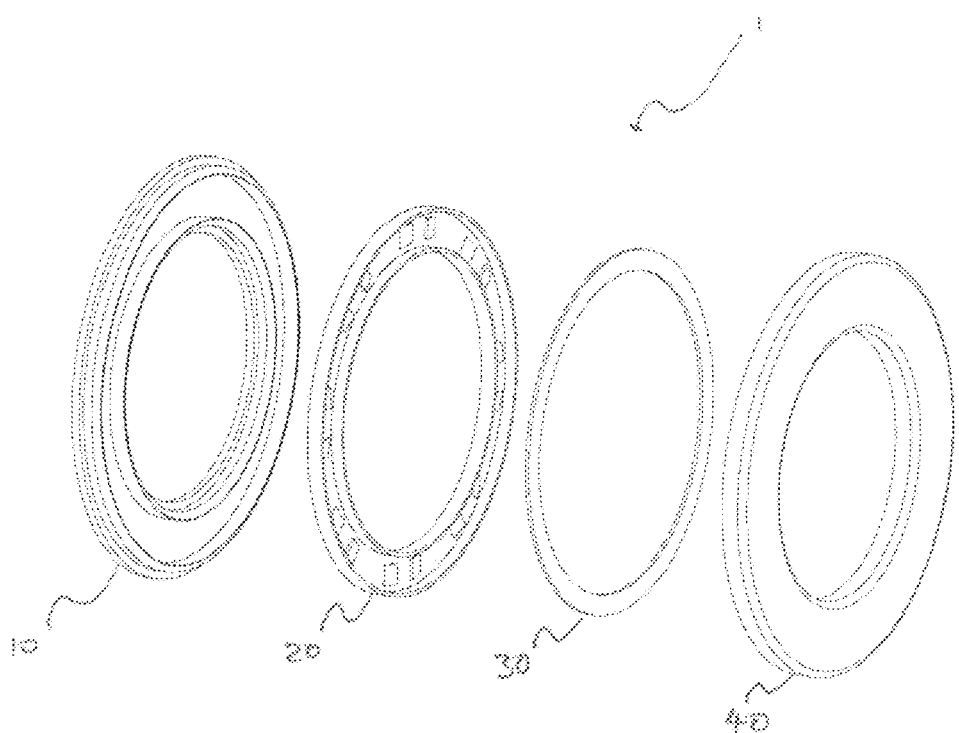
FIG. 1 is a diagram illustrating an exploded view of a vehicle design element including a light assembly according to an embodiment of the invention.

Referring now to FIG. 1, there is shown an exploded light assembly 1, which has a housing 10, a light guide 20, an annular printed circuit board (PCB) 30 featuring a plurality of light emitting diodes (LEDs, not shown), and a lens 40.

The light assembly 1 provides light output such that a viewer would see a homogenous annular light output.

Figure 2:
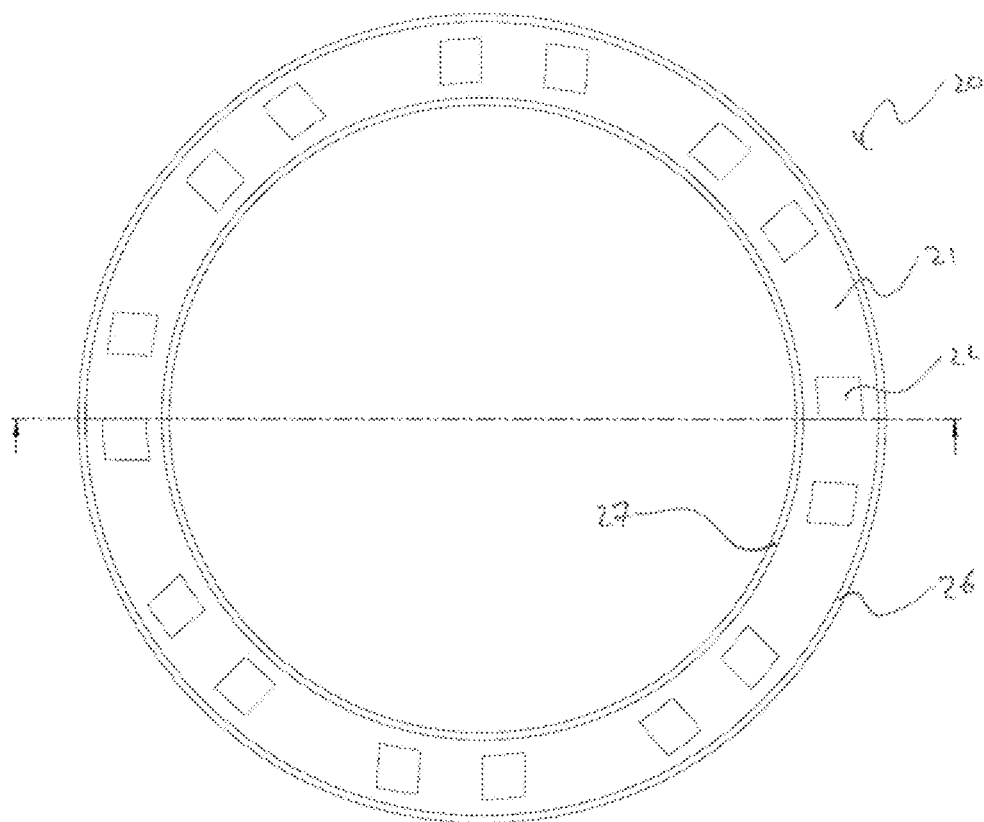
FIG. 2 is a diagram illustrating a plan view of an annular light guide with circumferential flanges and wedge shaped protrusions.
Figure 3:
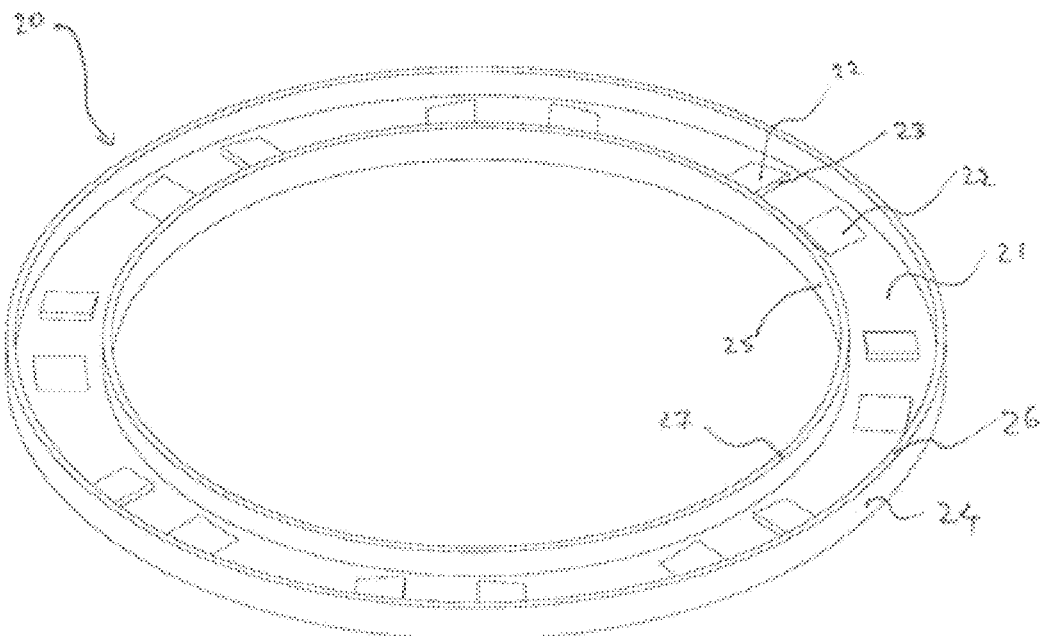
FIG. 3 is a diagram illustrating a perspective view of the annular light guide with circumferential flanges and wedge shaped protrusions.

Referring now to FIGS. 2 and 3 which show a plan and perspective view of the light guide 20, which has an annular base 21, on which there are a plurality of wedge shaped protrusions 22 which feature light receiving surfaces 23. The light guide further includes an outer circumferential flange 24 and an inner circumferential flange 25, both of which extend away from the annular base 21 towards viewable outer and inner light exits 26 and 27, respectively.

Figure 2A:
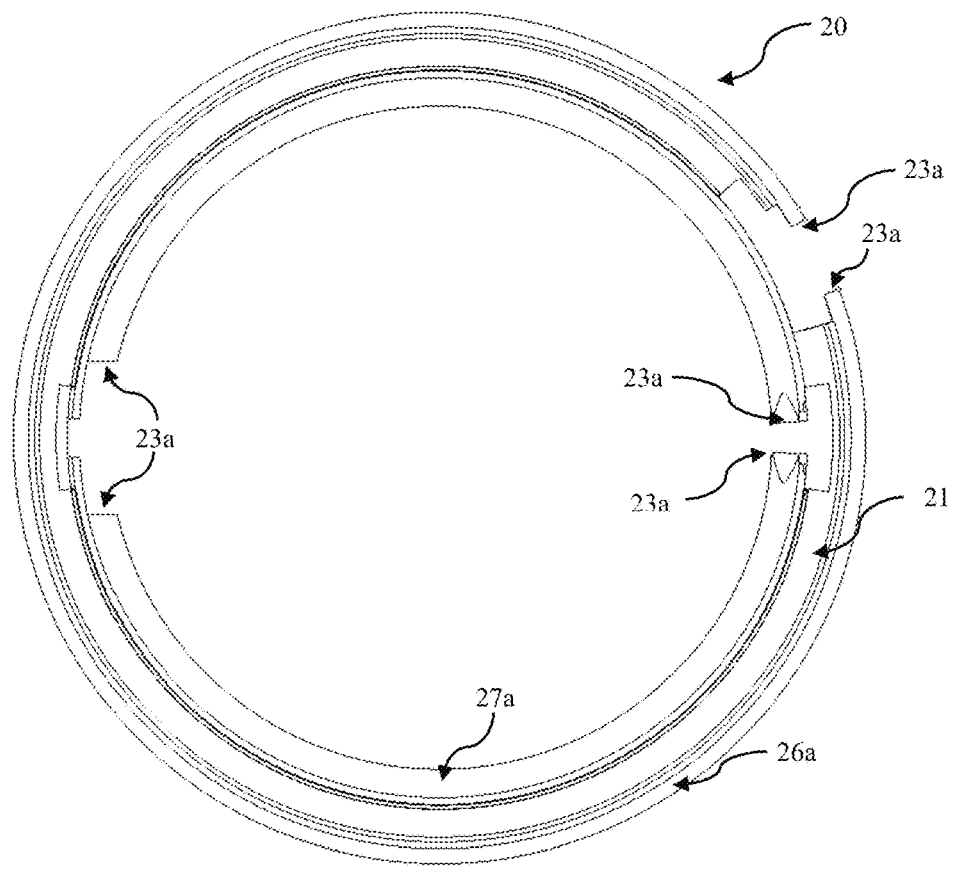
FIG. 2a is a diagram illustrating a plan view of an annular light guide with circumferential cylinders and light entry points at circumferential disconnections of the cylinder.
Figure 3A:
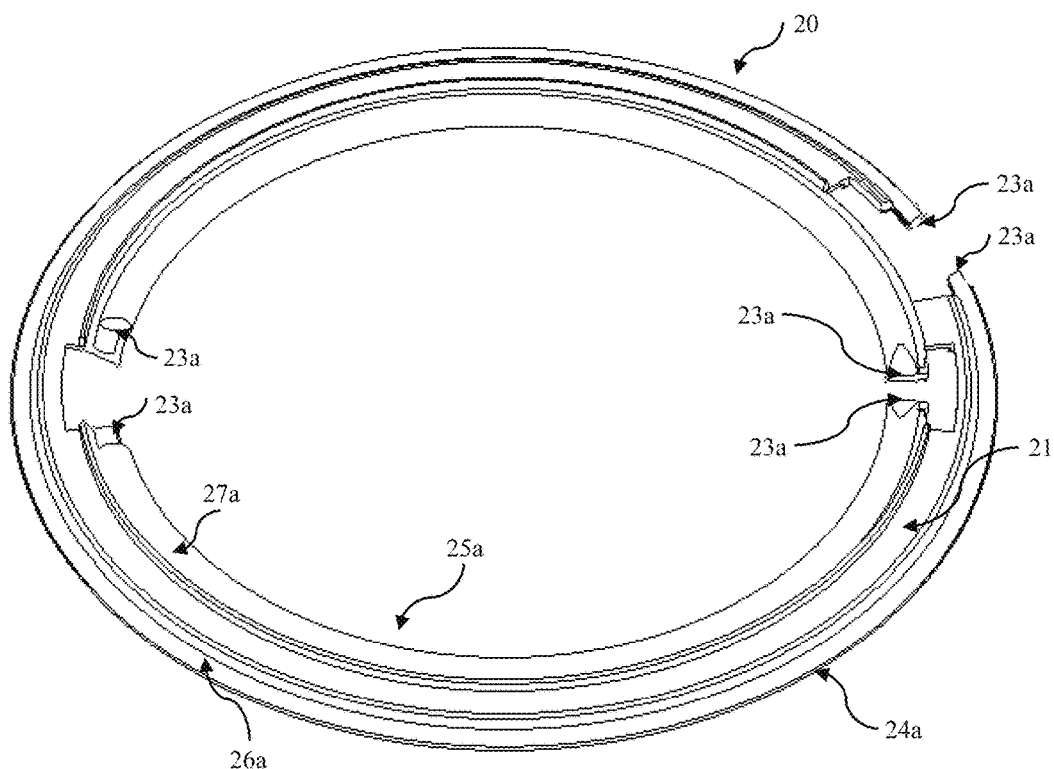
FIG. 3a is a diagram illustrating a perspective view of the annular light guide with circumferential cylinders and light entry points at circumferential disconnections of the cylinders.

Referring now to FIGS. 2a and 3a which show a plan and perspective view of the light guide 20, which has an annular base 21. On this annular base could be a plurality of wedge shaped protrusions which feature light receiving surface or light receiving surfaces, could exist at defined surface breakages around the circumferential flange 23a. The light guide further includes an outer circumferential cylinder 24a and an inner circumferential cylinder 25a, both of which extend away from the annular base towards viewable outer and inner light exits 26a and 27a respectively.

Whilst the flanges 24, 25 appear perpendicular to the base 21, equally they could be splayed inwardly or outwardly without changing the functionality of the light guide 20. It can be seen that the light guide transitions from the base to the flanges sharply, the sharp transition facilitating internal reflection of light through the light guide. In the preferred embodiment, this transition would have a radius of less than 2% of the height of the flange, however it is appreciated that an alternative embodiment with a transition radius of less than 10% of the height of the flange would still produce desirable results.

In the case of the circumferential cylinders, these could be placed at different angles to the annular base, dependant on the position of final light output required and inner and outer cylinders can have various configurations of diameters.

The wedge shaped protrusions 22 are equally spaced around the base 21 in pairs, with each pair having their respective light receiving surfaces 23 adjacent one another, and wherein in use, each light receiving surface 23 is orientated substantially orthogonal to the base 21 and will receive light from one of the plurality of LEDs, which are positioned adjacent to said receiving surfaces 23.

Figure 4:
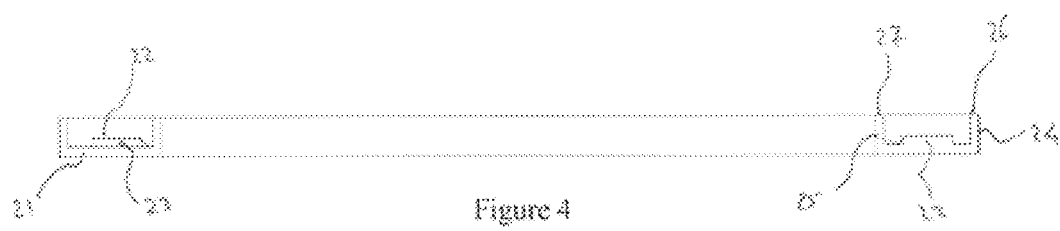
FIG. 4 is a diagram illustrating a cross-sectional view of the annular light guide with circumferential flanges and wedge shaped protrusions.

FIG. 4 shows how the outer and inner circumferential flanges 24 and 25, are configured such that they are orthogonal to the base 21. It can also be seen that, in this particular embodiment, the outer and inner light exits 26 and 27, are parallel to the base 21, thus also being orthogonal to the light receiving surfaces 23.

Figure 4A:
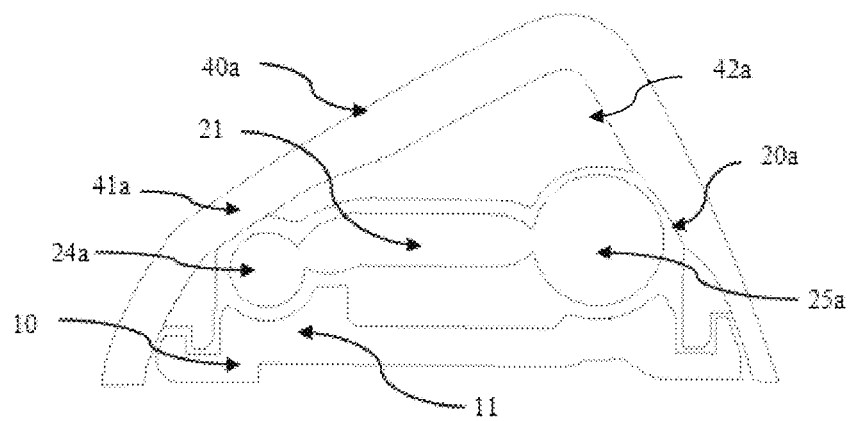
FIG. 4a is a diagram illustrating a cross sectional view of the light assembly with circumferential cylinders.

FIG. 4a shows how the outer and inner circumferential cylinders 24a and 25a are configured relative to the base 21. It can also be seen that, in this particular embodiment, the outer and inner light exits 26a, 27a can be at various segments around the diameter of the cylinder.

Figure 5:
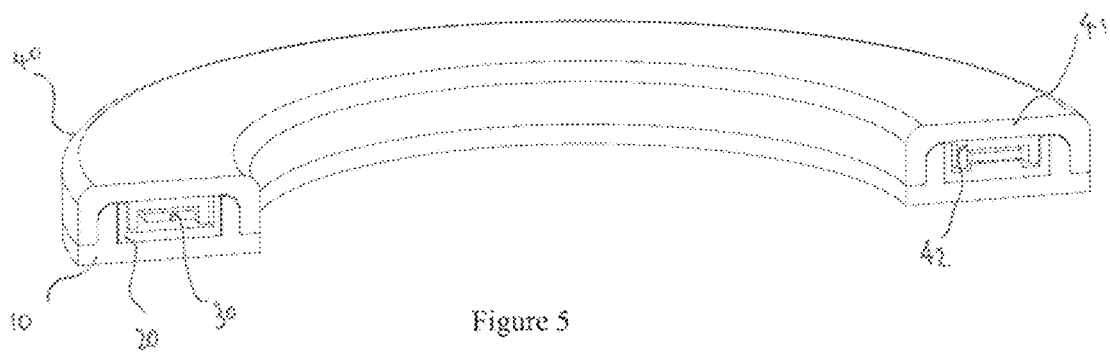
FIG. 5 is a diagram illustrating a cross-sectional view of the light assembly.

FIG. 5 shows a cross sectional view of the light assembly 1, showing how components of the light assembly 1 are assembled. The housing 10 forms the backing for the light assembly and may be manufactured from a black weather resistant plastic such as acrylonitrile styrene acrylate (ASA) or acrylonitrile butadiene styrene (ABS), or (PC) or polycarbonate blend and is configured to receive the light guide 20 which is mounted to the housing 10. The housing material optical properties can be selected to increase or decrease the final light output of the light assembly. A highly reflective material will increase the final light output level, a non-reflective material will reduce the final light output level of the light assembly. Transitional optic features on the housing 10 can be incorporated around the circumference of the cylinders to increase or decrease reflected light into the light guide, thereby creating a homogenous final light output of the light assembly. The PCB 30 is then mounted on the light guide 20. The PCB 30 may be coated white around the plurality of LEDs such that the light assembly 1 does not emit a green glow. The lens 40 is then connected or joined to the housing 10 (e.g. by welding) such that it sits over the PCB 30 and light guide 20.

The lens 40 is made of an outer component 41 and an inner component 42. The outer component 41 may be manufactured from a clear polycarbonate (PC) and the inner component 42 may be overmolded on to the inner surface of the outer component 41, using opaque PC. The lens inner component 42 material optic properties can be selected to increase or decrease the reflected light back into the light guide 20. A highly reflective material will increase the final light output level, a non-reflective material will reduce the overall final light output level of the light assembly. The lens 40 is configured such that the outer or inner component 41 and 42 joins to the housing 10 and the inner component 42 sits over the top of the PCB 30 and wedge shaped protrusions 22 such that it masks the PCB, and LEDs from being directly viewable through the lens 40.

Figure 6:
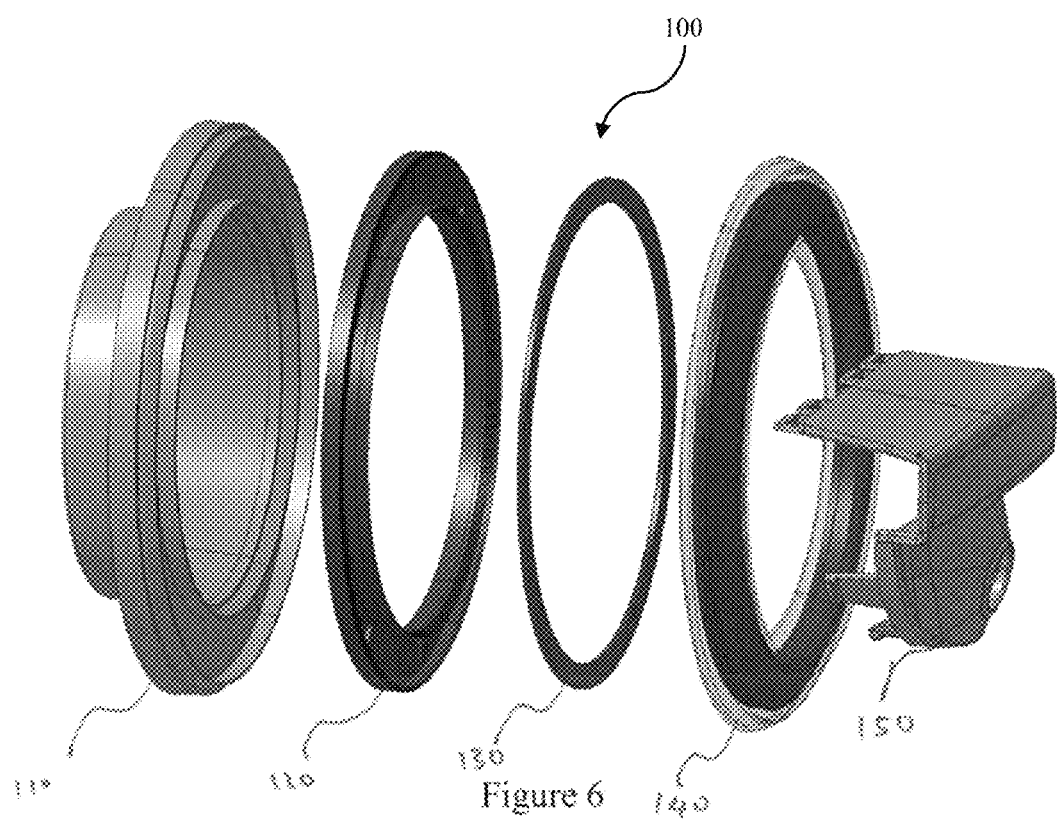
FIG. 6 is a diagram illustrating an exploded view of an automotive badge assembly according to another embodiment of the invention.
Figure 7:
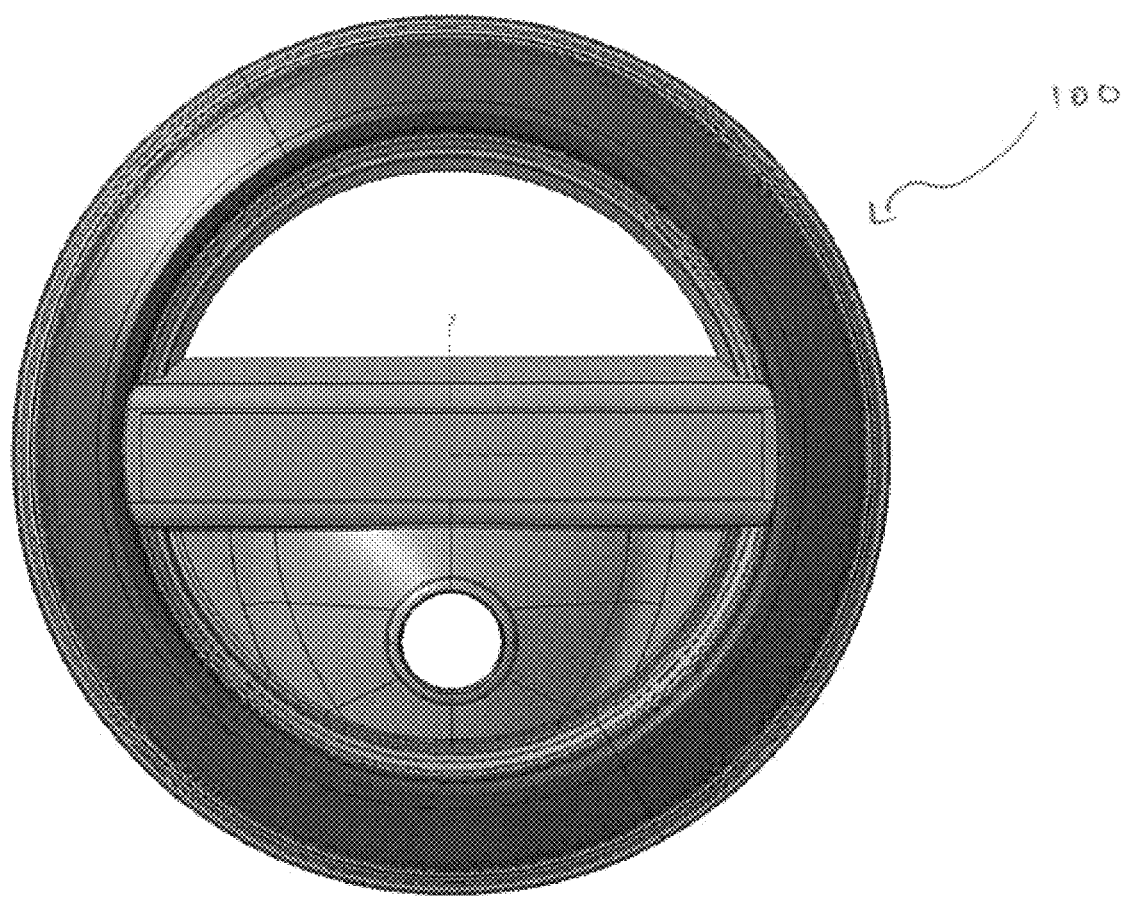
FIG. 7 is a diagram illustrating a plan view of the automotive badge assembly of FIG. 6.

Referring now to FIGS. 6 and 7 which show a light assembly as an alternative embodiment in the form of an automotive badge assembly 100. The badge 100 includes a housing 110, a light guide 120, a PCB 130, a lens 140 and a garnish 150.

Figure 8:
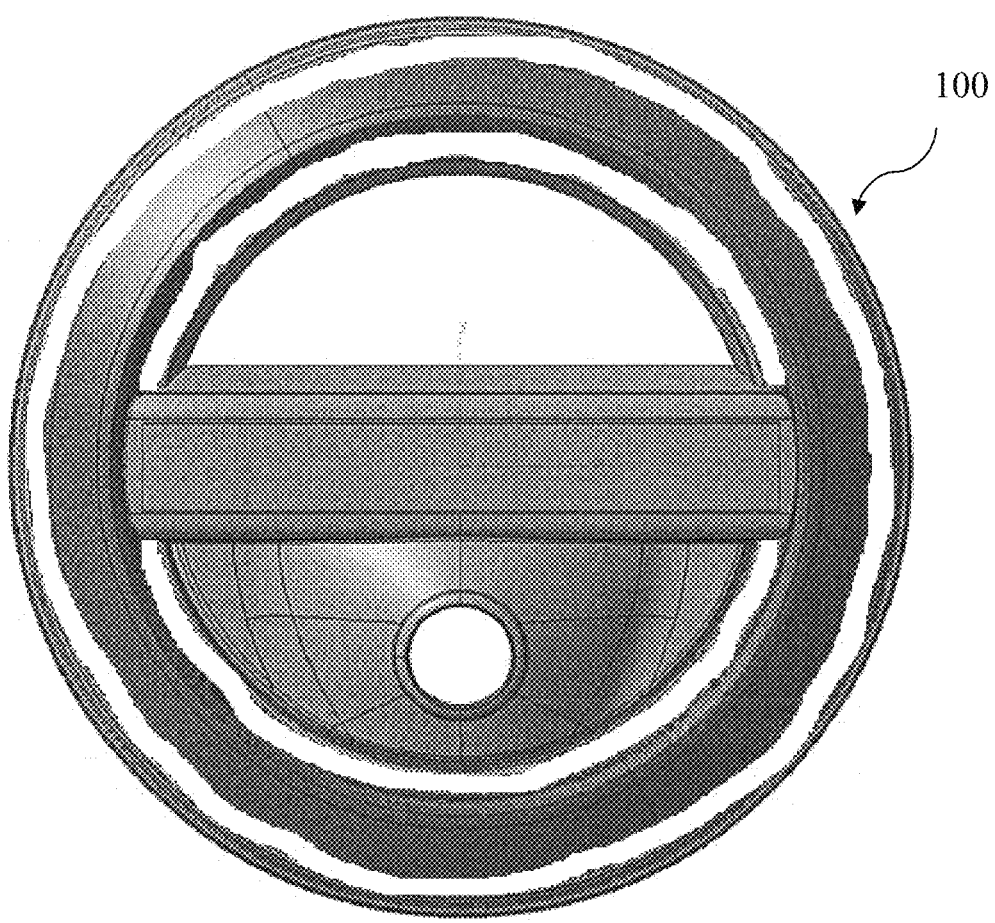
FIG. 8 is a diagram illustrating a plan view of the automotive badge assembly in an un-lit state.
Figure 9:
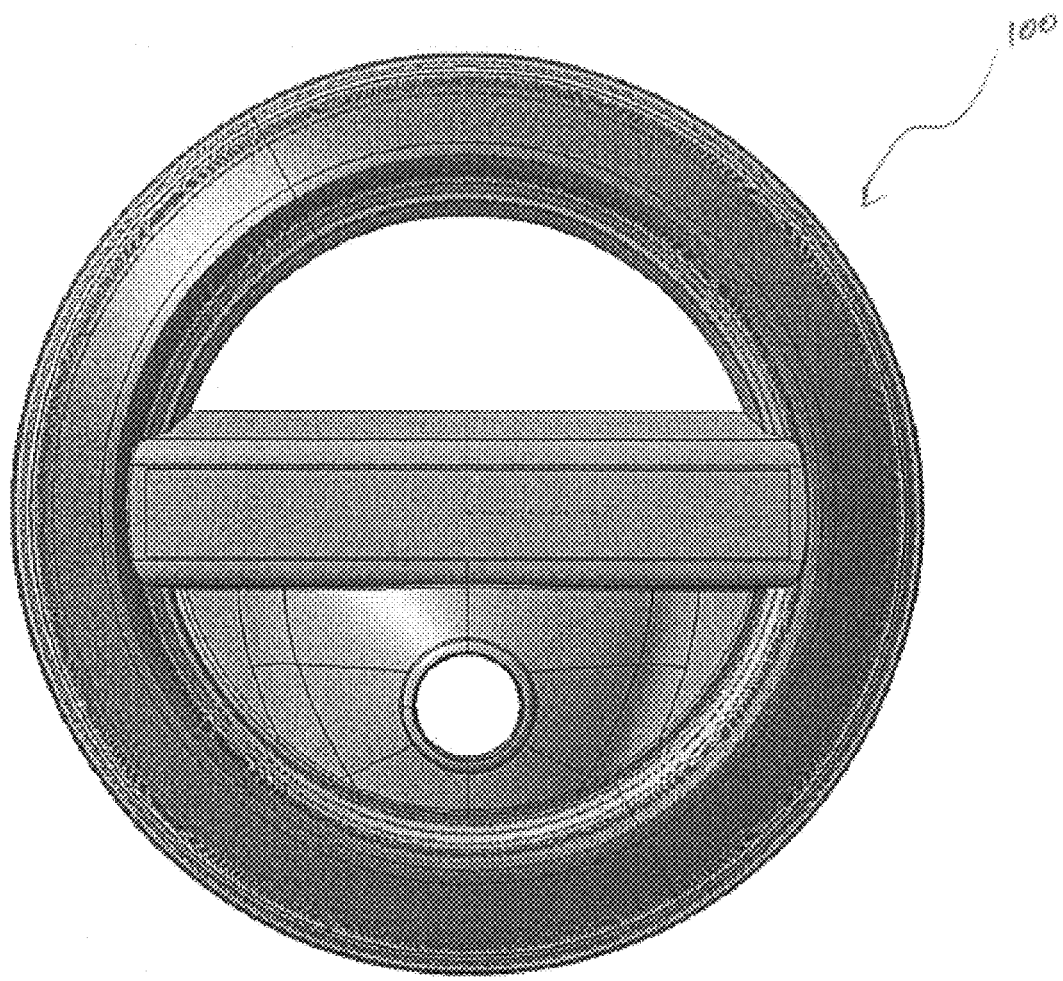
FIG. 9 is a diagram illustrating a plan view of the automotive badge assembly in a lit state.

FIGS. 8 and 9 show plan views of the badge assembly 100 in un-lit and lit states respectively. In FIG. 8, the light guide 120 is not visible and the lens 140 has a uniform chrome-like appearance. FIG. 9 shows that when the LED light sources are activated, the light guide 120 lights up and emits light through the lens 140 in a substantially uniform luminous intensity.

Figure 10:
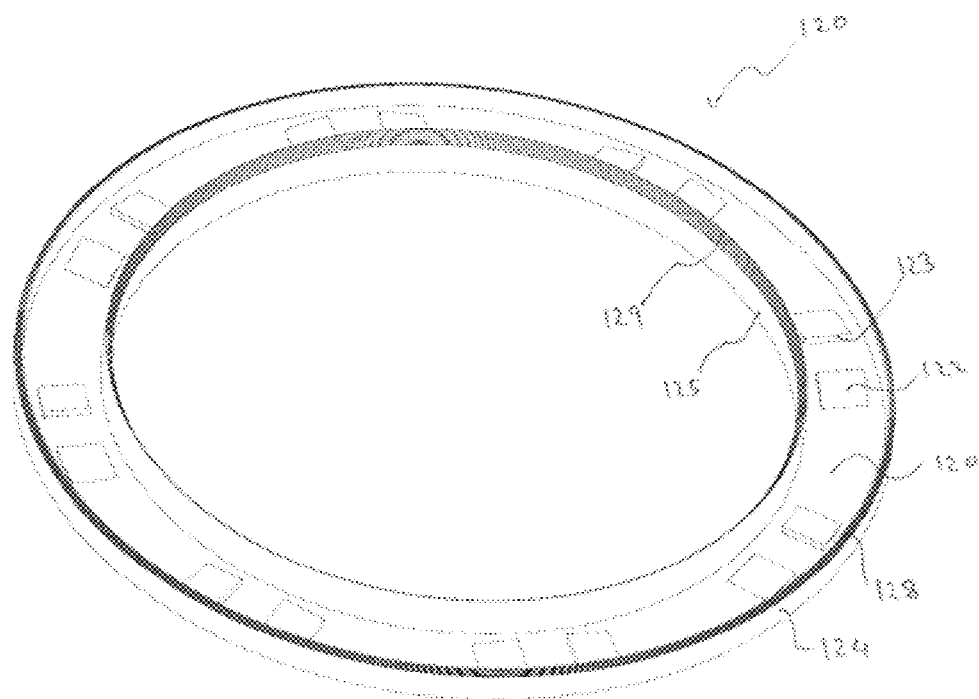
FIG. 10 is a diagram illustrating a perspective view of a light guide with circumferential flanges.

Referring now to FIG. 10 which shows a perspective view of the light guide 120, which has a substantially annular base 121, on which there are a plurality of wedge shaped protrusions 122 which feature light receiving surfaces 123. The light guide further includes a non-continuous outer circumferential flange 124 and non-continuous inner circumferential flange 125, both of which extend away from the base 121. The circumferential flanges further feature stepped light exits 126 and 127.

Figure 11:
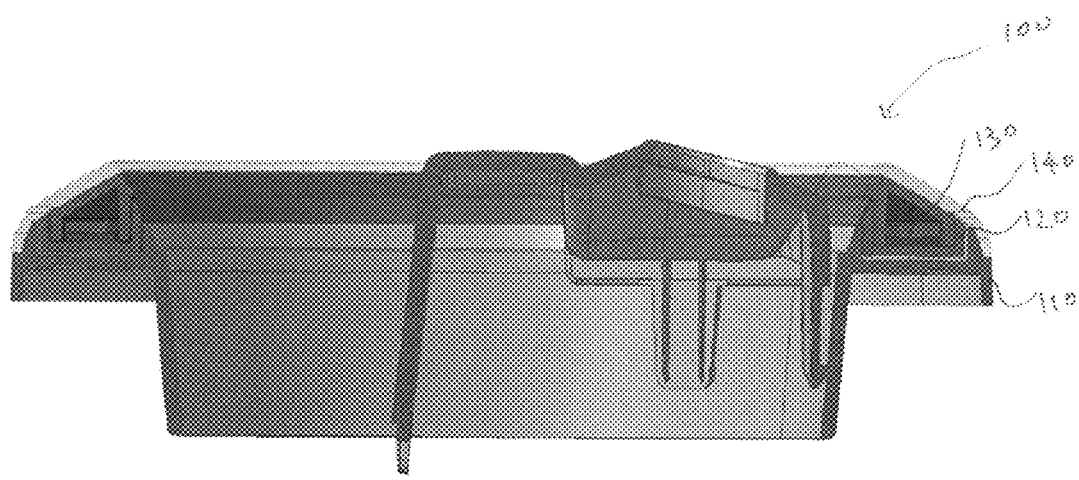
FIG. 11 is a diagram illustrating a cross-sectional view of the badge assembly of FIG. 6.

FIG. 11 shows a cross sectional view through the line A-A of the badge assembly 100 of FIG. 7. The configuration of the housing 110, light guide 120, PCB 130 and lens 140 of the badge assembly 100 is the same as that of the light assembly depicted in FIG. 5.

Figure 12:
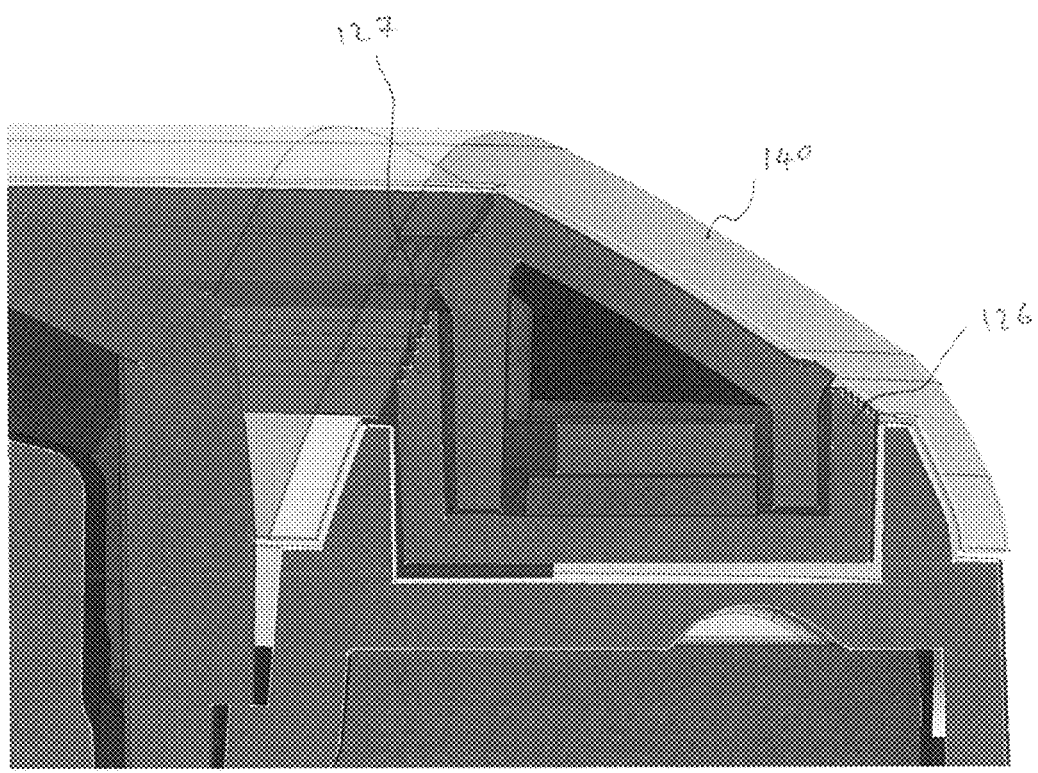
FIG. 12 is a diagram illustrating an enlarged cross-sectional view of the detail at I of FIG. 11 showing in more detail the construction of the automotive badge assembly.

Referring now to FIG. 12 which shows a detailed sectional view of the badge assembly 100 of FIG. 11. It is apparent in this view that the slope of the stepped light exits 126 and 127, of the light guide 120 are configured such that they follow the slope of the interior surface of the lens 140.

Figure 13:
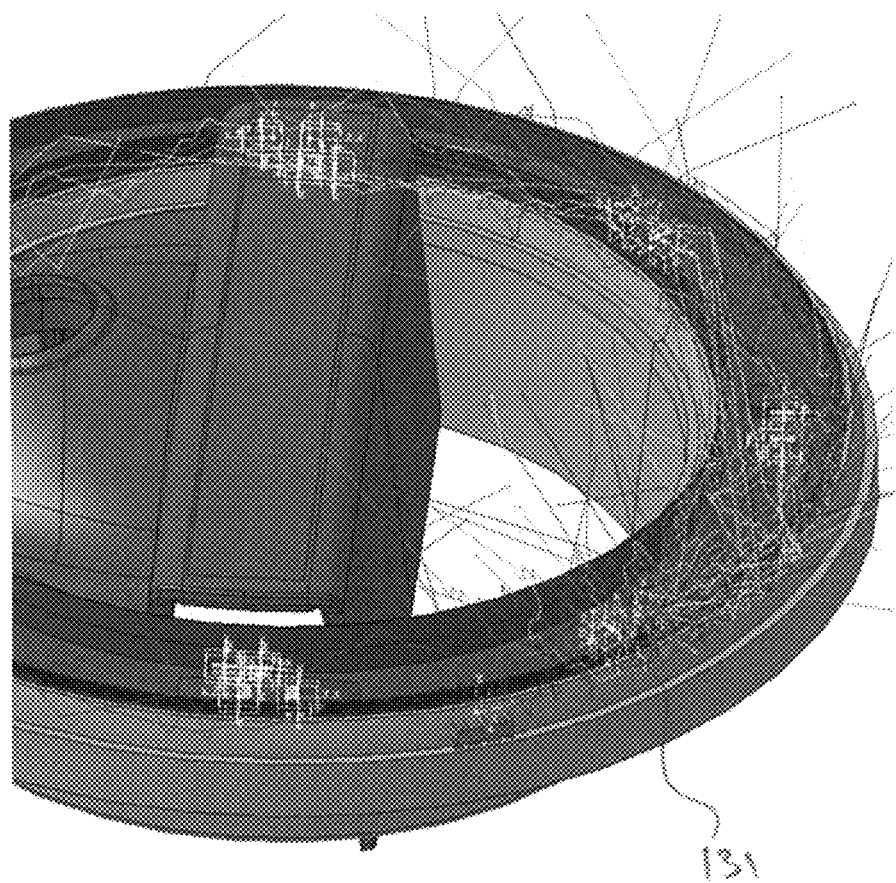
FIG. 13 is a diagram illustrating an isometric view of a schematic of the automotive badge assembly when in a lit state.
Figure 14:
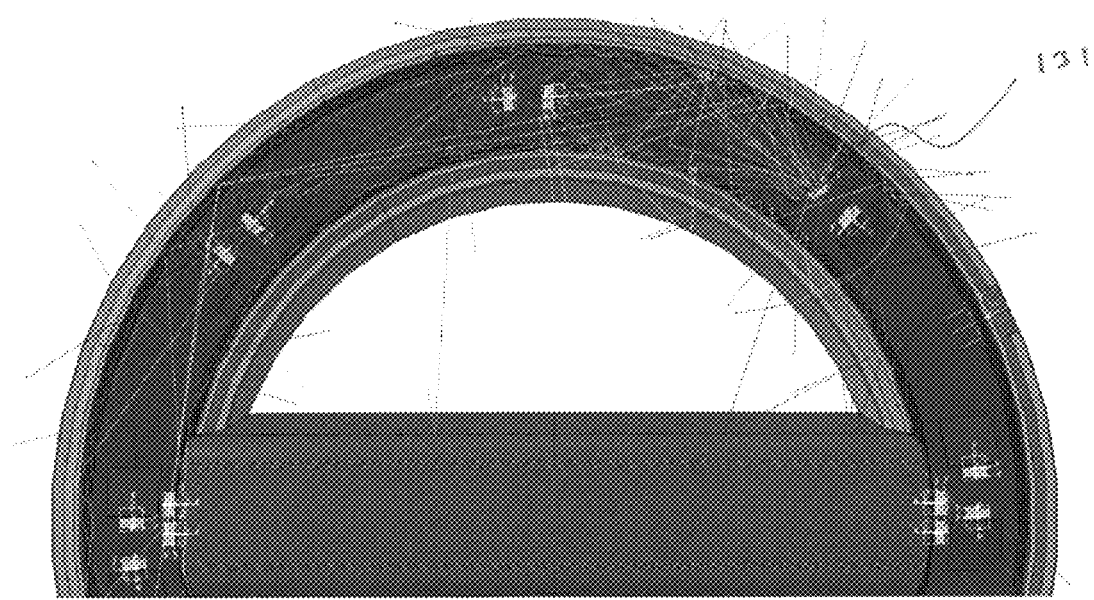
FIG. 14 is a diagram illustrating a plan view of a schematic of the automotive badge assembly when in a lit state.

FIGS. 13 and 14 show a schematic of the badge assembly of FIG. 7 when in a lit-state, illustrating how light rays behave when the light guide 120 is lit by a single LED light source 131, and the light rays enter the light guide 120 and are guided toward the stepped light exits 126 and 127. It can be seen that the light output is generally annular, however due to the non-continuous inner and outer circumferential flanges 124, 125, the light output is not continuous.

The light guide 120 is referred to as a particle filled lens to distinguish it from a crystal clear lens (or light guide) used in the manufacture of a traditional light guide. In a traditional light guide, light is transmitted from a light source to a point at some distance from the source with minimal loss by total internal reflection.

In this particle filled light guide 120, the transmission of light from the light source to the light exiting surfaces 126 and 127, is achieved through a combination of the use of internal reflection and light scattering particles. Internal reflection is encouraged through the geometry of the light guide 120, wherein light rays enter the light guide through the plurality of light receiving surfaces 123, and are guided through the wedge shaped protrusions 122 and into the base 121.

As can be seen in FIG. 14 in combination with FIG. 10, the orientation of the light receiving surfaces 123 with respect to the light guide 120 results in the light rays entering the light guide 120 approximately tangentially. The internal geometry of the light guide 120 encourages internal reflection with the incidence angle of the bulk of the light rays approaching the inner and outer walls of the outer and inner circumferential flanges 124 and 125, such that internal reflection is promoted, and the light rays will also reflect off the bottom surface of the base 121 such that they will travel up the inner and outer circumferential flanges 124 and 125, and exit through the outer and inner light exits 126 and 127.

As would be appreciated, the implementation of the stepped light exits 126 and 127, of this embodiment is for the purpose of promoting internal reflection within the light guide 120 when the light guide 120 is to sit below a sloped lens 140. Should the light guide 120 have instead featured a sloped light exit to match the lens 140, a large amount of light rays would have exited the light guide 120 at an undesirable location and/or angle.

Most light rays that enter the light guide 120 will encounter light scattering particles that alter the direction of the light rays. The effect of this light scattering is that light rays will spread throughout the light guide 120, further encouraging the light rays to exit through the light exiting surfaces 126 and 127 and also ensuring that an even distribution of light output occurs.

In the embodiment of the circumferential cylinder light guide 120 and light entry points at disconnected surfaces on the circumference of the cylinders, the annular base could be manufactured from non-diffusing clear material to promote total internal reflection and minimise losses through the annular base. The cylinders are then manufactured from particle filled, diffusing clear material to scatter the light and exit it through the light exit surfaces.

Figure 14A:
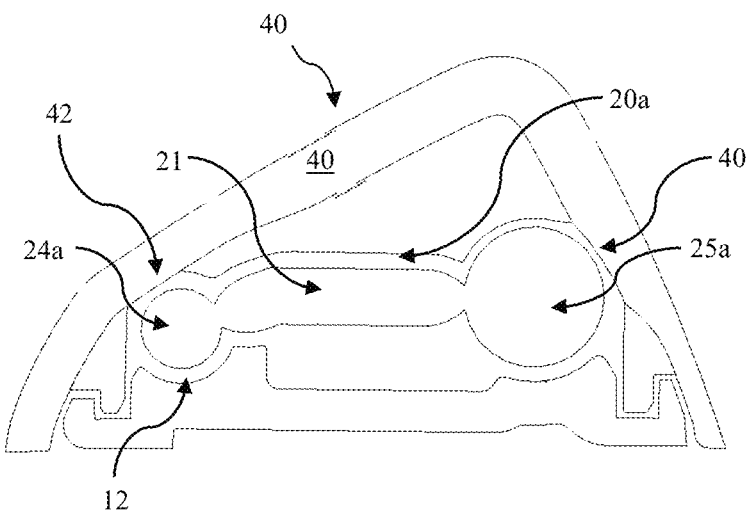
FIG. 14a is a diagram illustrating a cross-sectional view of the light assembly with circumferential cylinders.

FIG. 14a shows a detailed section of the assembly with a light guide using circumferential cylinders. In the light guide of 20a internal reflection is encouraged through the geometry of the inner and outer cylinders, wherein light rays enter the light guide through the light receiving surfaces at disconnections around the circumference of the light guide 23a, and are guided around the circumference of the cylinders. Due to the particle filled nature of the cylinders 24a and 25a the light rays are altered in direction if they encounter a light scattering particle. An amount of light rays will exit through the light exiting surfaces at an angle and direction matching the light exit windows of the lens 40 and these will be visible to a viewer of the light assembly.

A proportion of light rays will scatter at an angle and direction that do not match the light exit windows of the lens 40. The efficiency of the light assembly can be increased by reflecting these light rays from the lens inner component material 41 or the housing material 10 back into the light guide 20a. These reflected light rays then have an opportunity to be scattered in a direction that does match the light exit windows of the lens.

Additionally, focusing optical geometry 12 can be included in the housing 10 to increase the amount of reflected light rays back into the light tubes. This geometry can be varied around the circumference of the light cylinders to improve the homogeneity of the overall light output of the light assembly.

The light scattering particles may be titanium dioxide particles of sufficient size and concentration such that the light guide appears transparent when un-lit while providing a substantially uniform luminous intensity surface output when lit.

Figure 15:
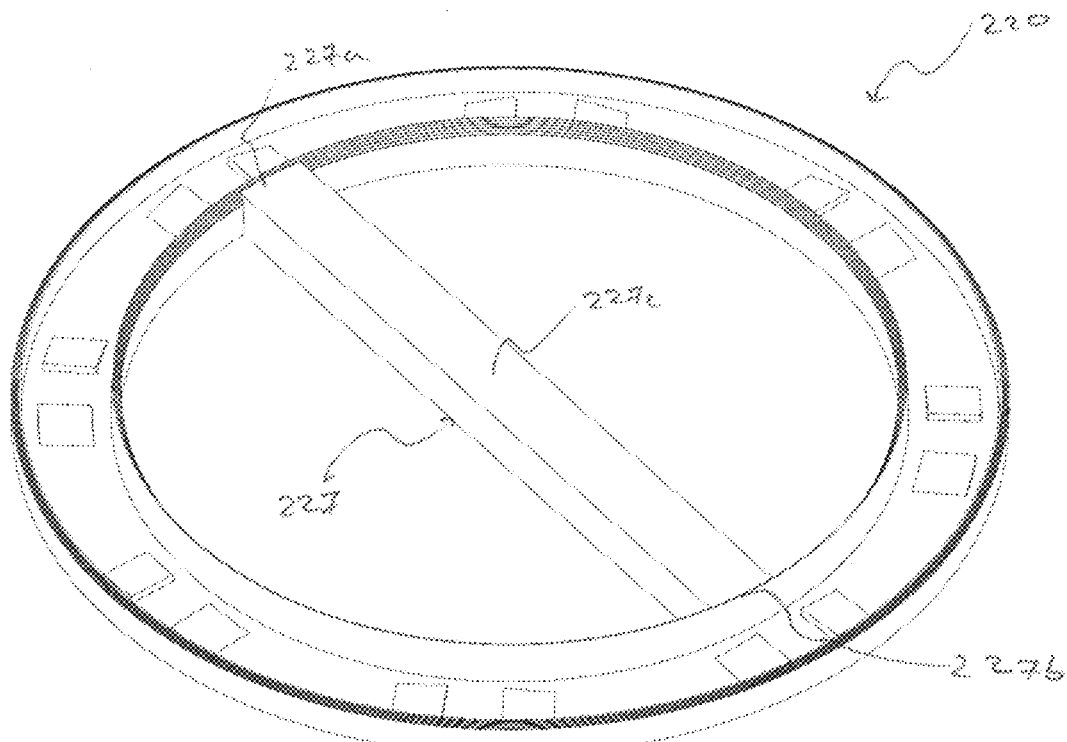
FIG. 15 is a diagram illustrating a perspective view of a light guide, according to an alternative embodiment.

FIG. 15 shows a perspective view of a light guide 220 according to an alternative embodiment, having the same features as the light guide 120. The light guide 220 also features a bridging member 227, manufactured from the same material as the light guide 220, which is located inside and bisects the substantially annular shape of the light guide 220. The bridging member 227 has a substantially trapezoidal cross-section and has first and second ends which are disposed as light receiving surfaces 227a, 227b, the bridging member 227 also featuring a light emitting surface 227c along its major surface.

In this embodiment, a PCB includes additional LEDs positioned adjacent to the light receiving surfaces 227a, 227b to direct light into the bridging member 227, wherein when lit, will provide a substantially uniform luminous intensity surface output. The bridging member 227 can be used in conjunction with the garnish (which covers the bridging member 227) to illuminate additional detail. For example, the garnish could feature cut-outs in the form of lettering or a logo, which would then be illuminated by the illuminated bridging member 227.

Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers.

The reference to any prior art in this specification is not, and should not be taken as, an acknowledgement of any form of suggestion that such prior art forms part of the common general knowledge.

It will be appreciated by those skilled in the art that the invention is not restricted in its use to the particular application described. Neither is the present invention restricted in its preferred embodiment with regard to the particular elements and/or features described or depicted herein. It will be appreciated that the invention is not limited to the embodiment or embodiments disclosed, but is capable of numerous rearrangements, modifications and substitutions without departing from the scope of the invention as set forth and defined by the following claims.

For instance, the light output can either be completely annular, or partially annular, additionally, the light output does not have to be perfectly annular, the same homogenous light output could be achieved with a light guide shaped to define an elliptical annular, smooth square, or similar base with circumferential flanges. The circumferential flanges may describe a complete circumference or alternatively maybe non-continuous describing a part circumference.

Please note that the following claims are provisional claims only, and are provided as examples of possible claims and are not intended to limit the scope of what may be claimed in any future patent applications based on the present application. Integers may be added to or omitted from the example claims at a later date so as to further define or re-define the invention.

REFERENCE SIGNS 1 light assembly
10 housing
12 focusing opical geometry
20, 20a light guide
21 annular base
22 protrusions
23, 23a light receiving surfaces
24 outer circumferential flange
24a outer circumferential cylinder
25 inner circumferential flange
25a inner circumferential cylinder
26, 26a outer light exits
27, 27a inner light exists
30 printed circuit board
40, 40a lens
41, 41a outer component
42, 42a inner component
100 badge assembly
110 housing
120 light guide
121 annular base
122 protrusions
123 light receiving surfaces
124 non-continuos outer circumferential flange
125 non-continuos inner circumferential flange
126 stepped outer light exits
127 stepped inner light exists
130 printed circuit board
131 LED light source
140 lens
150 garnish
220 light guide
227 bridging member
227a, 227b light receiving surfaces
227c light emitting surface

The invention claimed is:

1. A light assembly for a vehicle design element, the assembly comprising:
a light guide, the light guide comprising a plurality of light receiving surfaces; and
a plurality of light sources comprising light emitting diodes (LEDs) on a circuit board, the light sources being arranged adjacent to and directed towards respective light receiving surfaces,
wherein the light guide is shaped to define an annular base lying in a first plane and to further define at least one circumferential flange or cylinder disposed generally orthogonal, or inwardly or outwardly splayed to the first plane, the circumferential flange or cylinder including a viewable annular light exit and extending away from the annular base of the light guide towards the viewable annular light exit, and
the annular base comprises a plurality of shaped elements in form of disconnections, recesses, holes or wedge-shaped protrusions, extending away from the first plane, each shaped element of the light guide defining one of the light receiving surfaces for receiving incident light from a respective adjacent light source, and a plurality of the light receiving surfaces are orientated substantially transverse to the annular base.

2. The light assembly of claim 1, wherein the light guide transitions from the annular base to the flange or cylinder, sharply with a radius of less than 10% of a height of the flange or cylinder, the sharp transition facilitating internal reflection of light emitted from the light sources.

3. The light assembly of claim 1, wherein the light guide is shaped to comprise two annular spaced-apart circumferential flanges, each flange extending away from the annular base towards a respective viewable annular light exit, the two viewable annular light exits radially spaced apart from each other.

4. The light assembly of claim 1, wherein the light guide is shaped to comprise two spaced apart circumferential cylinders, each cylinder extending away from the annular base towards a respective viewable annular light exit, the two viewable light exits radially spaced apart from each other.

5. The light assembly of claim 1, wherein the circumferential flanges or cylinders are non-continuous to provide disconnections such that circumferential light entry points at disconnected surfaces on the circumference of the flanges or cylinders are provided.

6. The light assembly of claim 1, wherein the annular light exit comprises a plurality of steps, the steps promoting internal reflection.

7. The light assembly of claim 1, wherein the light guide is substantially transparent and without any visible discrete optic features in an un-lit state, while being diffusive in a lit state.

8. The light assembly of claim 1, wherein the light guide is substantially transparent and non-diffusive in both a lit and un-lit state, while the circumferential flanges or cylinders are substantially transparent in an un-lit state, while being diffusive in a lit state.

9. The light assembly of claim 1, wherein a housing is provided behind the light guide, which at least one of incorporates transitional reflective optics that vary the amount of light reflected back into the circumferential flanges or cylinders, and
comprises a black material.

10. The light assembly of claim 1, wherein the light guide also features a bridging member, manufactured from the same material as the light guide, which is located inside and bisects the substantially annular shape of the light guide, and the bridging member has first and second ends which are disposed as light receiving surfaces and a light emitting surface along its major surface.

11. The light assembly of claim 10, wherein the bridging member has a substantially trapezoidal cross-section.

12. The light assembly of claim 1, wherein at least one of
the printed circuit board has an annular shape, and
the printed circuit board is coated white around the plurality of LEDs.

13. The light assembly of claim 11, wherein the printed circuit board comprises additional light sources positioned adjacent to the light receiving surfaces to direct light into the bridging member.

14. The light assembly of claim 10, wherein the bridging member is used in conjunction with a garnish, the garnish comprising cut-outs in the form of lettering or a logo.

15. The light assembly of claim 1, wherein the lens has an outer component made from a clear material, and an inner component which is at least one of over moulded on the inner surface of the outer component and made from opaque material.

16. The assembly of claim 1, wherein at least one of
the inner or outer component joins to the housing, and
the inner component sits on top of the printed circuit board and the shaped elements.

17. A vehicle design element including a light assembly according to claim 1.

* * * * *